United States Patent [19]
Kuo et al.

[11] 3,940,747
[45] Feb. 24, 1976

[54] HIGH DENSITY, HIGH SPEED RANDOM ACCESS READ-WRITE MEMORY

[75] Inventors: Chang-Kiang Kuo; Norishisa Kitagawa, both of Houston, Tex.

[73] Assignee: Texas Instruments Incorporated, Dallas, Tex.

[22] Filed: Aug. 2, 1973

[21] Appl. No.: 385,122

[52] U.S. Cl. ............... 340/173 DR; 340/173 R
[51] Int. Cl.² ............... G06F 13/00; G11C 13/00
[58] Field of Search ..... 340/172.5, 173 DR, 173 D4

[56] References Cited
UNITED STATES PATENTS

| | | | |
|---|---|---|---|
| 3,514,765 | 5/1970 | Christensen | 340/173 DR |
| 3,533,083 | 10/1970 | Liepa | 340/172.5 |
| 3,736,572 | 5/1973 | Tu | 340/172.5 X |
| 3,774,176 | 11/1973 | Stein et al. | 340/173 DR |
| 3,838,404 | 9/1974 | Heeren | 340/173 DR |

OTHER PUBLICATIONS
"Storage Array and Sense/Refresh Circuit for Single Transistor Memory Cells"—Stein et al.—IEEE Journal—Vol. se7, No. 5—Oct. 1972—pp. 336-340.
"Silicongate Dynamic MOS Crams 1,024 Bits on a Chip"—Hoff, Jr.—Electronics—Aug. 1970—pp. 68-73.

Primary Examiner—Harvey E. Springborn
Attorney, Agent, or Firm—Harold Levine; Edward J. Connors, Jr.; John G. Graham

[57] ABSTRACT

The disclosure relates to a high density, high speed random access memory (RAM) which uses one transistor per storage cell. The cells are in a matrix of rows and columns, and a sense and refresh amplifier is located in the center of each column. Row address circuitry selects one row to be read out. The data stored in the cells in the selected row are transferred to the sense and refresh amplifiers, and column address circuitry selects one of the rows to be coupled to circuitry which performs both input and output functions.

3 Claims, 10 Drawing Figures

HIGH DENSITY, HIGH SPEED RANDOM ACCESS READ-WRITE MEMORY

This invention relates to a high density, high speed random access read-write memory and, more specifically, to such a device which is capable of providing random access to a large number of bit storage, i.e., 4096 bit storage cells.

Random access storage devices which utilize a single MOS chip have been known in the art. The number of storage cells capable of being placed on a single MOS chip has been limited by the ability to pack components closer together or reduce component sizes as well as by operation speed considerations. Many of the known random access storage devices utilizing a single chip require a three transistor storage cell, these being difficult to process as well as consuming a relatively large amount of space. These devices also present timing problems within the chip and therefore require plural clocks.

In accordance with the present invention, there is provided a high speed, high density RAM which is capable of having more bit storage cells than any known commercial RAMs, which has higher speed than known very high density RAMs and which has high yield due to design thereof.

Briefly, the above is accomplished by providing an MOS chip having a single external clock input which, internally of the chip, generates other timing signals, some of which are responsive to the receipt of all address bits of the address to delay the beginning of certain timing cycles until all information is received, thereby preventing error, yet commencing operation as soon as all address data is received to improve chip speed of operation. The RAM includes a basic storage cell which is composed of one transistor and one capacitor, thereby providing smaller cells and greater cell density as well as increasing chip speed due to decrease in stray capacitances. The circuit also includes a sense amplifier associated with each column of a storage matrix to provide refreshing of data, transfer of data in or out as well as operation in conjunction with dummy cells and a precharge voltage generator to precharge the sense amplifier to predetermined levels to allow accurate comparison with stored data or data to be written in and provide accurate results. The circuit also includes an input buffer circuit which connects the source of the driver to the input to permit the use of a small driver transistor while still accurately operating with TTL devices as well as other devices. This reduction in driver size permits greater component packing density as well as increased speed due to capacitance reduction. The input buffer also has provision for power conservation when reading out a "O" at one of its outputs by isolating the output from the power source and coupling the output to ground.

It is therefore an object of this invention to provide an MOS random access memory having relatively very high component density and high speed of operation.

It is a further object of this invention to provide a random access memory on a single MOS chip having a single clock input.

It is a yet further object of this invention to provide a timing circuit for an MOS memory which generates clock signals internally in response to accurate reception of address signals.

It is a still further object of this invention to provide an MOS RAM utilizing a sense amplifier for refresh as well as read and write functions which is precharged to a predetermined voltage level which can be varied based upon supply voltage ($V_{DD}$) and threshold voltage ($V_T$) to provide accurate data sensing.

The above objects and still further objects of the invention will become immediately apparent to those skilled in the art after consideration of the following preferred embodiment thereof, which is provided by way of example and not by way of limitation, wherein.

Figure 1:
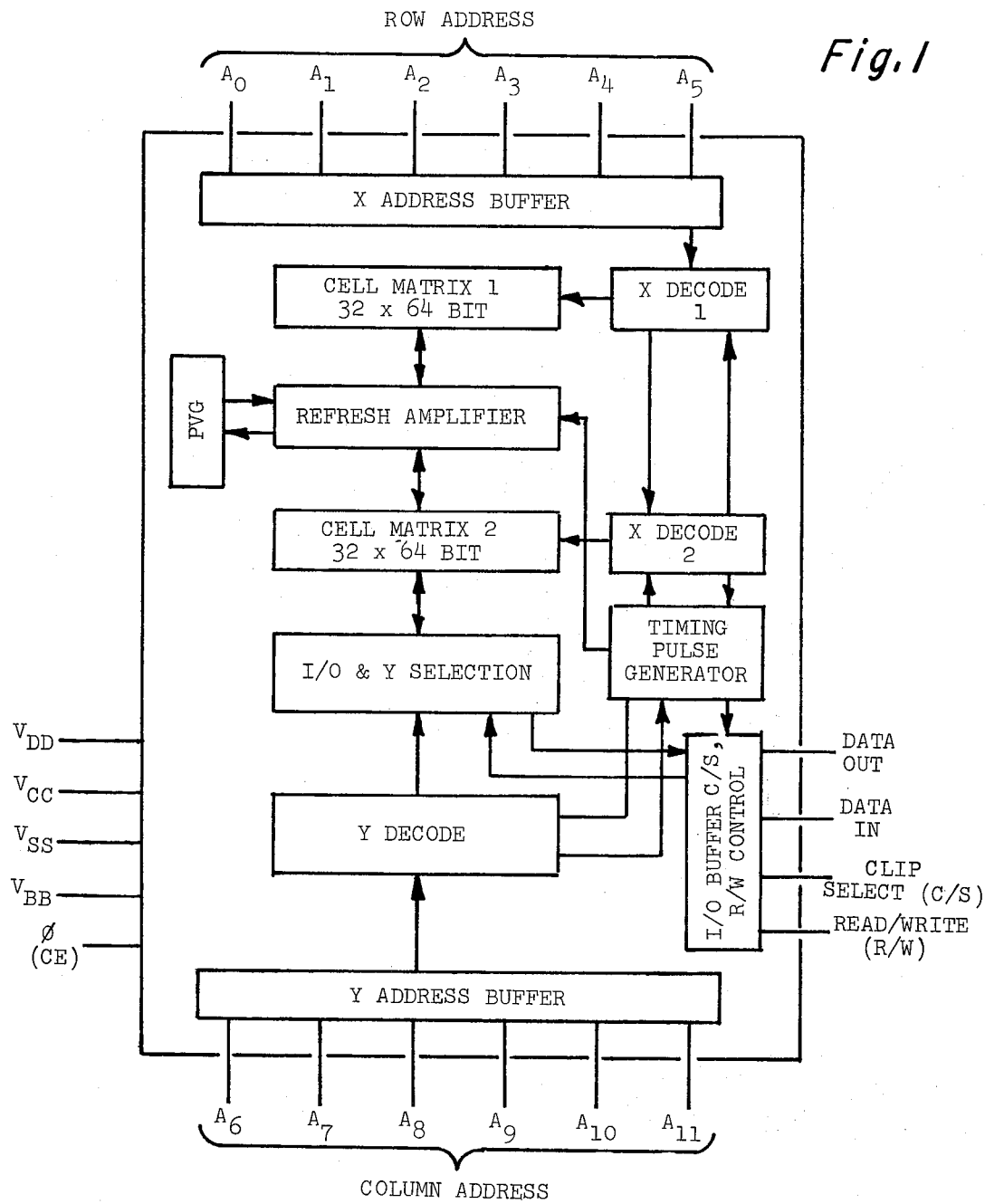
FIG. 1 is a block diagram of the MOS chip of the present invention with circuits formed therein.

Referring first to FIG. 1, there is shown a schematic diagram of a high density, high speed random access read-write memory in accordance with the present invention. In the preferred embodiment, the memory is described in the form of a single semiconductor chip, such chip containing $n$-channel MOS transistors formed therein. The chip includes 21 terminals or external connections, these including six row address input terminals ($A_0$ to $A_5$), six column address input terminals ($A_6$ to $A_{11}$), external voltage input terminals $V_{DD}$, $V_{CC}$, $V_{SS}$, and $V_{BB}$ and external clock input terminal $\phi$ or CE, a data output terminal, a data input terminal, a chip select (C/S) terminal which can be used as an additional address signal and indicates whether this particular chip of a multi-chip array has been selected and a read/write (R/W) terminal which indicates whether data is to be written in at the selected address or read out from the selected address.

The chip includes a memory matrix which is composed of cell matrix 1 and cell matrix 2, each cell matrix having 32 rows and 64 columns of cells to provide a 4096 cell memory matrix. A particular cell in the memory matrix is selected for read out when a read signal is on the read/write line by providing a six bit row address and a six bit column address, the row address being fed to an X address buffer which converts the input signal from TTL level to MOS level. The output of the buffer is fed to an X decoder which is composed of X decoder 1 for cell matrix 1 and X decoder 2 for cell matrix 2. The X decoder converts the output of the buffer to a one out of sixty-four output which, via a driver, energizes the selected row in the cell matrix. The selected row is read out to a refresh amplifier and thus to an input/output (arrangement labelled I/O) and Y selection circuit. The refresh function is well known and is nothing more than a rejuvenation of the outputs of the cells of the selected row prior to restoring the signals in the cells from which they came. Of this row of data signals, one signal is selected by means of the column or Y address buffer and Y decode circuit. The Y address buffer functions in a manner similar to the X address buffer, the output of this buffer controlling the Y decode circuit which is a gating circuit which allows only the data from the cell in the selected column to be read out to the input/output (I/O) buffer from which the data is read out on the DATA OUT lead. The timing of the circuit operations within the chip is controlled by a single external clock which provides pulses at the clock input $\phi$ (CE) to the chip. Other timing pulses are developed within the chip by the timing pulse generator, under control of the external clock. The PVG is a precharge voltage generator and provides the function of precharging circuitry on the chip (to be explained later hereinbelow) to provide an accurate reference for determination as to whether a "1" or a "0" is being sensed.

In the event data is to be written into the cell matrix, the read/write line will have a write signal thereon and data will be fed to the chip along the DATA IN line. The data flow will now operate in substantially the reverse order of that described above for the read function. The incoming bit signal will be fed via the I/O buffer to the I/O and Y selection circuit wherein the bit signal will be allowed to pass to the sense amplifier (to be described in detail hereinbelow) associated with the selected column only. This data signal will then be applied to all cells of the selected column, the cell in which said data signal is stored being determined by the particular row selected by the X decoder under control of the row address and X address buffer.

Figure 2:
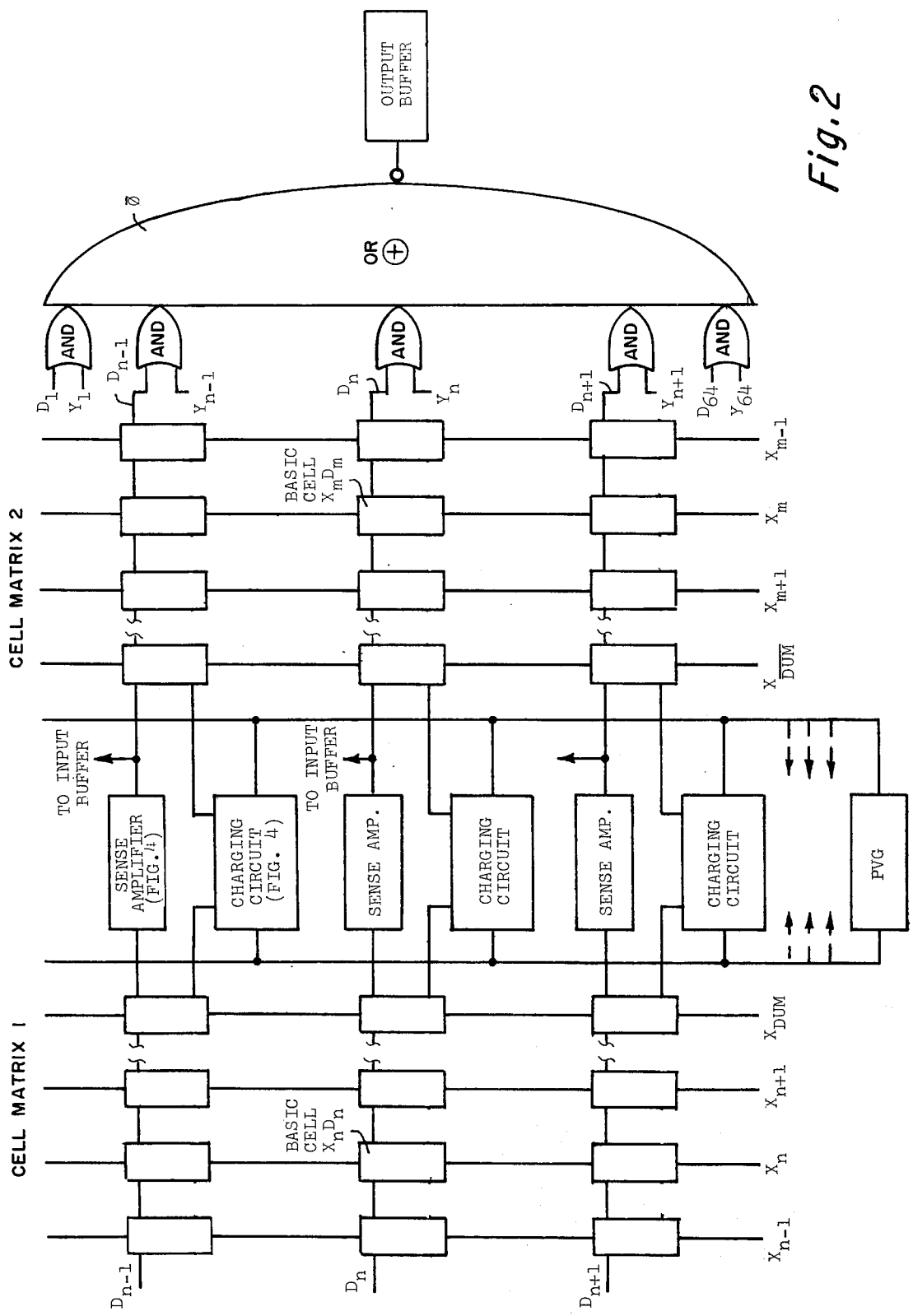
FIG. 2 is a block diagram of cell matrices 1 and 2, refresh amplifier, I/O and Y selection and PVG.

Referring now to FIG. 2, there is shown a typical cell matrix composed of plural basic memory cells, one at the junction of each X line and each D line. The basic memory cells to the left of the sense amplifier in FIG. 2 would correspond to cell matrix 1 of FIG. 1 and the basic memory cells to the right of the sense amplifiers in FIG. 2 would correspond to cell matrix 2 of FIG. 1. The sense amplifiers and charging circuits (noted as FIG. 4) in FIG. 2 correspond to the refresh amplifier of FIG. 1. The gating circuits composed of AND gates, each coupled to one lead of a one out of sixty-four Y address from the Y decoder and one of the D lines or column lines, all said AND gates coupled to an OR gate, corresponds to the I/O and Y selection circuit of FIG. 1. The circuitry is designed whereby the six bit row address signal (FIG. 1) results in the X decoder selecting one of the X lines in the memory matrix. If an X line to the left of the sense amplifiers of FIG. 2 is selected, the line $X_{\overline{DUM}}$ will also be selected. As will be explained in detail hereinbelow, selection of an X address provides read out of all memory cells along the selected row via the sense amplifier with refreshing. However, the only cell actually read out by the logic is determined by the six bit column address and Y decoder (FIG. 1) which enables only one of the AND gates of FIG. 2.

Figure 3:
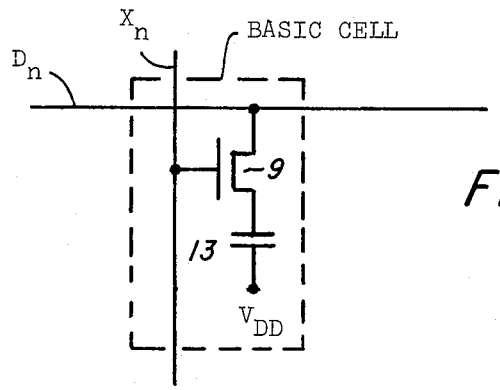
FIG. 3 is the circuit diagram of a basic storage cell $X_n D_n$ of FIG. 2 in accordance with the present invention.

The basic cell is shown in detail in FIG. 3 where the cell at the matrix junction $X_nD_n$ of FIG. 2 is set forth. It can be seen that the enablement of the row line $X_n$ turns on the transistor 9 and permits the charge stored on the capacitor 13 to be applied to the line $D_n$. The voltage of the capacitor 13 is either about zero (ground) to denote one storage condition, or some higher voltage to denote the opposite storage condition. The line $V_{DD}$ is a positive source of potential.

The capacitor 13, in fact, represents the capacitance between $V_{DD}$ and line $D_n$ as shown as well as stray capacitance within the chip which is generated in the chip between line $D_n$ and the terminal of capacitor 13 remote from $V_{DD}$.

Figure 4:
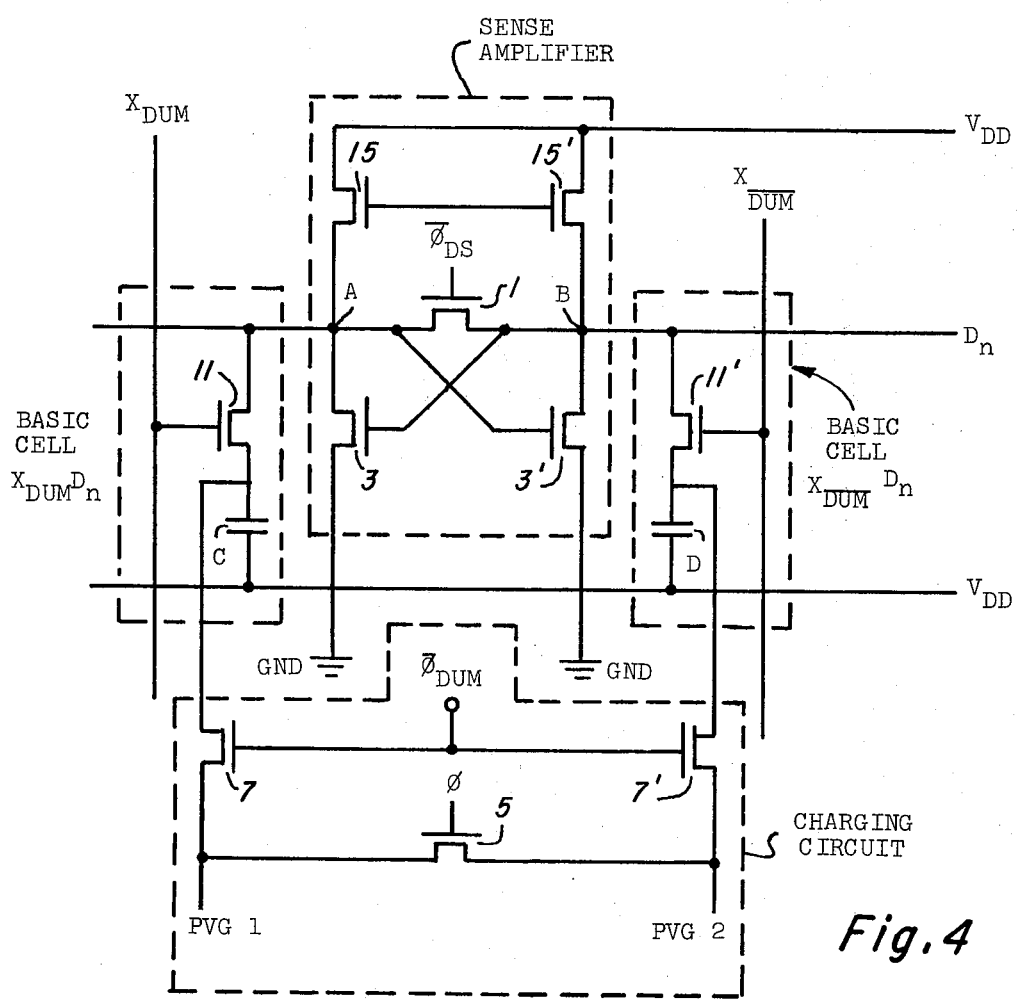
FIG. 4 is a circuit diagram of a sense amplifier with associated dummy cells and charging circuit.

FIG. 4 sets forth in detail a typical set of dummy cells $X_{DUM}D_n$ and $X_{\overline{DUM}}D_n$ coupled to a sense amplifier with a charging circuit identified in FIG. 2 as "FIG. 4." There is one sense amplifier and one charging circuit in each column. The precharge voltage generator (PVG) shown in FIGS. 1 and 2 applies a $V_{DD}$ and $V_T$ tracking voltage to the dummy storage cells. The PVG circuit will be described in detail hereinbelow with respect to FIG. 7. The term $V_T$ represents the "threshhold voltage" which is that voltage required on the gate of the transistor to cause it to conduct.

Figure 5:
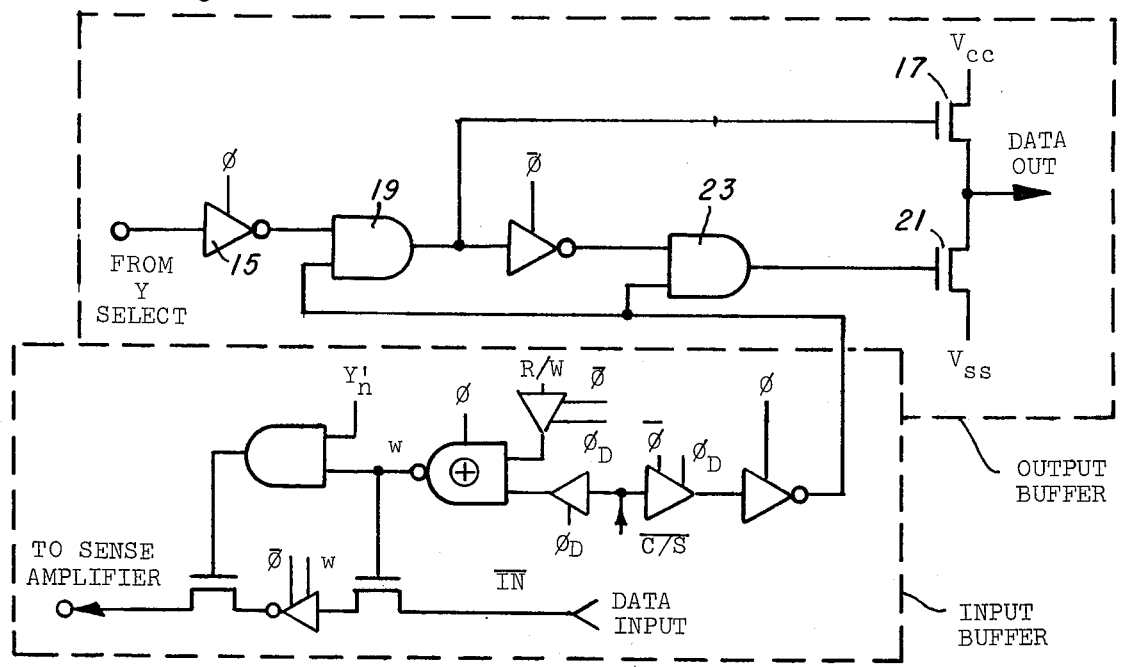
FIG. 5 is a logic diagram of the I/O buffer.

FIG. 5 is a logic diagram of the box in FIG. 2 labeled output buffer as well as the input buffer which is coupled to the sense amplifier as shown in FIG. 2.

Figure 6:
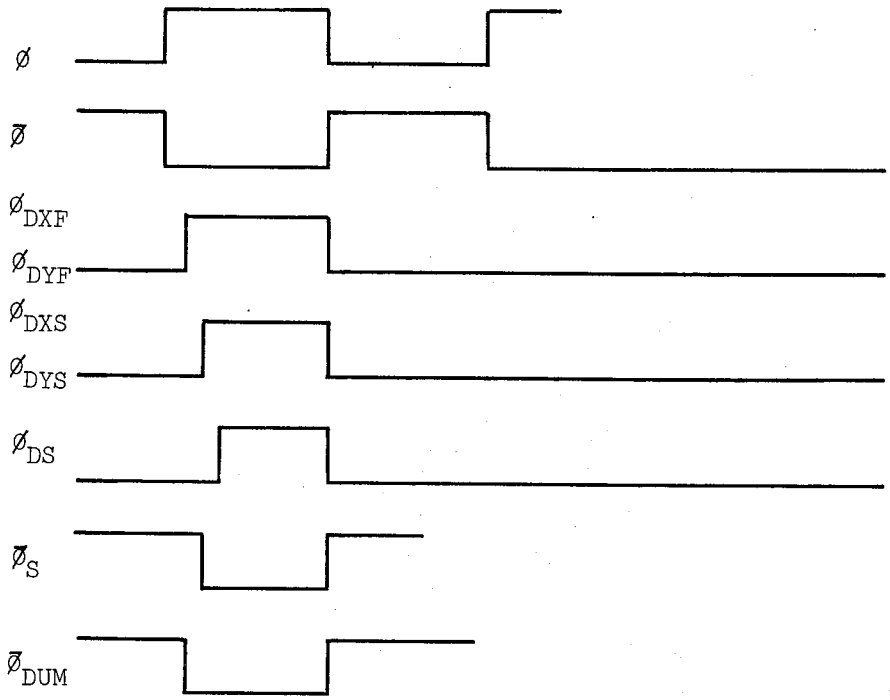
FIG. 6 is a timing diagram in the form of a graphic representation of voltage vs. time of the various clock or timing signals produced in the chip from the external clock signal $\phi$.

FIG. 6 sets forth the time relation of the various timing signals present on the chip. The timing signals $\phi$ is introduced externally of the chip as noted earlier, $\overline{\phi}$, the logical inverse of $\phi$, being generated internally. The remaining timing signals are generated within the chip itself from the $\phi$ signal as will be set forth in detail hereinbelow.

Referring now to FIGS. 2 to 6, the read out function will be described in detail. If we assume that the data stored in basic cell $X_nD_n$ of FIG. 2 is to be read out, this is accomplished by providing the necessary row address input to define the address of the row line $X_n$. Also, the column address input will define the address $Y_n$. In addition, as noted supra, when an X address to the left of the sense amplifier in FIG. 2 is selected the line $X_{\overline{DUM}}$ is also selected.

The initial operations take place during $\overline{\phi}$ and $\overline{\phi}_s$ time. During the $\overline{\phi}$ time period, the PVG (of FIG. 7) generates the high voltage previously described at lead PVG 1 (FIG. 4) and ground voltage at lead PVG 2. Since the sense amplifier (FIG. 4) operates as a flip flop, one of the nodes A and B is initially of high voltage (above $V_T$). When $\overline{\phi}_s$ is on, $\phi_{DS}$ is off (FIG. 6) so nodes A and B (FIG. 4) are equalized in voltage through transistor 1. If we assume that the voltage at node A is high relative to node B, node B charges up through low conducting transistor 1 to equalize the voltage of nodes A and B and then turns on transistor 3 to allow node A to discharge toward $V_T$.

Referring again to FIG. 4, during $\phi$ time, transistor 5 is turned on and thereby equalizes the voltage at the PVG 1 and PVG 2 inputs to $V_{DD} - 2V_T/2$. Therefore, during $T_{DUM}$ time, transistors 7 and 7' conduct and charge the capacitors C and D in the dummy cells to the voltage $V_{DD} - 2V_T/2$. The voltage $V_{DD} - 2V_T/2$ is selected to be about midway between the "1" and the "0" voltage stored in a basic cell and acts as a $V_{DD}$ and $V_T$ tracking reference to allow more accurate determination of a stored "1" or "0."

After the system has been set up as described above, the line $X_n$ (FIG. 2) will be energized and turn on transistor 9 (FIG. 3). The charge on the capacitor 13 of the cell will be applied to the line $D_n$ and is therefore applied to node A of the sense amplifier (FIG. 4). Selection of line $X_n$ also causes selection of line $X_{\overline{DUM}}$ and, accordingly, the charge on the capacitor D (FIG. 4) will be applied to node B via transistor 11. As described supra, the nodes A and B of the sense amplifier were initially in the balanced state. Therefore, the voltage now applied to node B via capacitor 11 is midway between a "1" and a "0" so the sense amplifier can easily determine whether the voltage at node A represents a "1" or a "0" and the flip flop will conduct accordingly. If node A is above the node B voltage, transistor 3' will conduct and a ground potential will be applied to node B. This is accomplished during $\phi_{DS}$ time when transistors 15 and 15' are conducting to apply $V_{DD}$ to the nodes A and B. Alternatively, if a ground voltage is applied to node A, node B would have charged up to above $V_T$ and turned on transistor 3, thereby applying a ground potential to node A.

At the end of $\phi_{DS}$ time, assuming a "1" was read out of cell $X_nD_n$, node A (FIG. 4) is charged to about $V_T$ below $V_{DD}$ voltage and node B is at ground potential. The voltage on node A is at this time applied to capacitor 13 of the cell $X_nD_n$. Also, the information read out from all other cells along the row $X_n$ has undergone the same operations discussed above. Therefore, when the signal is removed from $X_n$, the cells along the row $X_n$ have been refreshed.

Also, at the end of $\phi_{DS}$ time, the opposite of the signal stored in basic cell $X_nD_n$ is applied to node B (FIG. 4). Node B, as seen from FIG. 2, is applied to an AND gate having inputs $D_n$ and $Y_n$. All of the remaining columns are coupled to AND gates in the same manner. Only one of these AND gates will be enabled, this being determined by the Y address, as noted previously. Assuming $Y_n$ was selected, the data bit was read out through the OR gate of the selection circuit to the output buffer which is set forth in detail in FIG. 5.

The output buffer (FIG. 5) includes a gate which is open during $\phi$ time and passes the output of the selection circuit to an AND gate 19 which is enabled when (1) the chip has been selected (C/S), (2) a $\phi$ chip enable signal is provided. The output of gate 19 makes transistor 17 conduct when transistor 21 is also caused to conduct via AND gate 23 when the $\bar{\phi}$ signal is not present. Because the output signals of gates 19 and 23 are opposite, only one of the output push-pull devices 17 and 21 will conduct, depending upon the output of the sense amplifier to the output buffer circuit. This provides the output signal at the DATA OUT pin of the chip. When one or both the signals C/S and $\phi$ (CE) are off, device 17 and 21 turn off and the data output terminal is isolated or in a high impedance state.

When the data to be read out is located in a basic cell to the right of the sense amplifiers in FIG. 2, as, for example, basic cell $X_mD_n$, the operation is altered slightly as follows. When the address line $X_m$ is addressed, the line $X_{DUM}$ is also addressed. This will mean that the signal stored in the capacitor 13 of the cell $X_mD_n$ will appear at node B (FIG. 4) which is the portion of line $D_n$ to the right of the sense amplifier. Node A is charged to a voltage between a "1" and a "0" as previously described.

It can be seen that, since the sense amplifiers operate as flip flops, signals read out of cells to the left of the sense amplifiers, if high at node A, are low at node B and vice versa. This is also true for cells to the right of the sense amplifiers. Therefore, a high voltage (or low voltage, as the case may be) in a cell to the left of the sense amplifiers appears at the gate circuits as a low voltage whereas a high voltage in a cell to the right of the sense amplifiers appears at the gate circuits as a high voltage. It is therefore apparent that a stored logical "1" to the left of the sense amplifiers is of opposite voltage to a stored logical "1" to the right of the sense amplifiers.

In order to provide a write function of information into a cell to the left of the sense amplifiers, such as cell $X_nD_n$, the chip select (C/S) signal for the chip is provided and with the proper read/write signal and $Y_n$ address as shown in FIG. 5, the signal on the data input line is passed via the input buffer to the right hand side of the sense amplifier at the point noted in FIG. 2 with the arrow "to input buffer." The sense amplifiers have otherwise at this time been precharged as stated above for the read out operation with nodes A and B (FIG. 4) at slightly below $V_T$. The input signal from the input buffer is applied to node B of the sense amplifier associated with line $D_n$, this being the output line from the input buffer which has been selected by the Y address. The lines from the input buffer (not shown) which are associated with the remaining sense amplifiers are not carrying signals since the address associated therewith has not been selected. Since the sense amplifiers operate as flip flops, if we assume a high voltage was impressed at node B, transistor 3 will conduct and bring node A to ground potential. During this operation, X address line $X_n$ has been energized, thereby allowing the capacitor 13 of cell $X_nD_n$ to be charged to the voltage of node A through transistor 9, this voltage being ground potential. When the signal on line $X_n$ is removed, the new input has been stored in cell $X_nD_n$. It is noted that during the write operation, since all cells along the row $X_n$ are addressed, the entire row $X_n$ is refreshed in the manner previously described except for the cell $X_nD_n$ wherein new data has been entered.

In the event the new data at the input is to be read into a cell to the right of the sense amplifier, such as cell $X_mD_n$, the operation would be the same as explained above, except that the signal impressed at node B would not be inverted by the sense amplifier prior to storage. It can therefore be seen that the voltage on the capacitor 13 which stores a "1" to the left of the sense amplifiers is the opposite of that which stores a "1" to the right of the sense amplifiers. This reversal of voltage level accommodates for the reversal discussed hereinabove for the read out operation.

Figure 7:
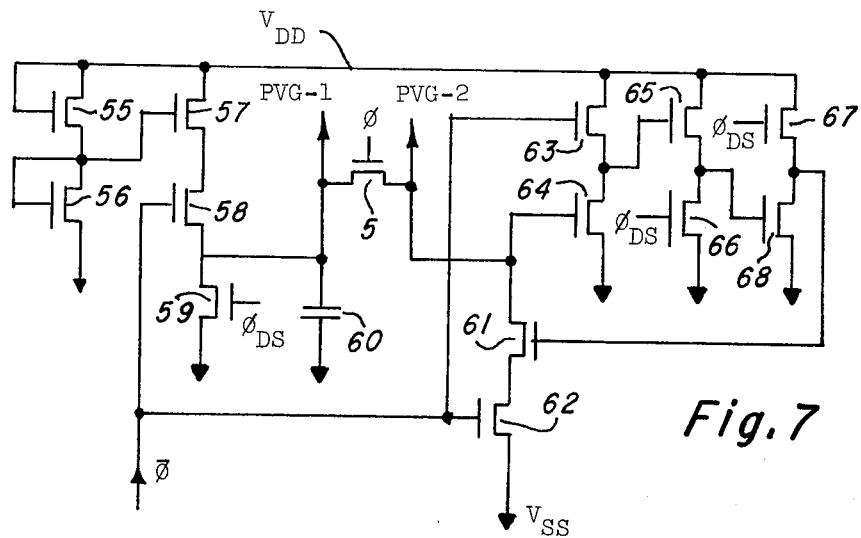
FIG. 7 is a circuit diagram of the precharge voltage generator (PVG)

Referring now to FIG. 7, there is shown a circuit diagram of the precharge voltage generator (PVG). This circuit provides an intermediate $V_T$, $V_{DD}$ tracking voltage at the sense amplifiers as discussed above via the inputs PVG 1 and PVG 2 as shown in FIG. 4. One PVG precharges all of the sense amplifiers as noted in FIG. 2 via the charging circuit. Transistors 55 and 56 conduct, but transistor 56 is of such high resistance that the voltage drop across transistor 55 is one threshold voltage $V_T$. Therefore, the voltage at the gate of transistor 57 is $V_{DD} - V_T$. Transistor 57 conducts and provides an additional voltage drop of $V_T$ so that the voltage at the source of transistor 57 is $V_{DD} - 2V_T$. Transistor 58 provides the proper timing and allows the voltage at the source of transistor 57 to be impressed on the line PVG 1 in accordance with the input signal on the gate of transistor 58 and charging the capacitor 60. The transistor 58 is turned on at the end of a $\phi$ time and stays on until the beginning of the next $\phi$ time. Transistor 59 is turned on during $\phi_{DS}$ time to discharge capacitor 60 prior to a new recharging cycle in order to accurately control the output voltage of line PVG 1.

Line PVG 2 provides a zero voltage as follows. During $\phi_{DS}$ time, transistor 67 is turned on and thereby turns on transistor 61. At the end of the $\phi$ time period, transistor 62 is turned on and short circuits line PVG 2 to ground to provide the zero voltage level thereon. It can therefore be seen that at the beginning of each $\phi$ time period, a voltage of $V_{DD} - 2V_T$ is provided at the line PVG 1 and a zero voltage is provided at line PVG 2. When $\phi$ time is on, transistor 5 is turned on and equalizes the voltage at PVG 1 and PVG 2 to about $(V_{DD}/2) - V_T$. Since the stored voltage "1" at the cell is $(V_{DD} - V_T - \Delta V)$ and "0" is ground, the intermediate voltage to which the dummy cells should be charged is $(V_{DD}/2) - V_T + (V_T - \Delta V)/2$, which is about equal to the precharge voltage, where $(-\Delta V)$ is a time dependent voltage drop which is assumed to be about $V_T$ at operating conditions.

The row select signal $(X_1 - - - X_n - - -)$ and the column select signals $(Y_1 - - - Y_n - - -)$ as shown in FIG. 2 are provided by means of the address buffers and associated decoder. The X address buffer and decoder is essentially the same as the Y address buffer and decoder, so only one will be described in detail.

The row address signals $A_o$ to $A_5$ are applied to the X address buffer (FIG. 1). The X address buffer is composed of six circuits of the type shown in FIG. 8, one of the row address signals being applied to each of these circuits. The purpose of the address buffer is to permit a TTL to MOS input. The outputs of TTL devices are normally too low for proper operation of MOS circuits. Therefore, conventional circuits have required elements with a large beta, this requiring the use of a large driver since conductance is related to the square of the input voltage. A large driver takes up a great deal of chip space and increases parasitic capacitance. This cuts down on both component density as well as speed of operation. This problem is overcome by utilizing a buffer of small size by coupling the source of the driver of the second inverter stage back to the buffer input.

Figure 8:
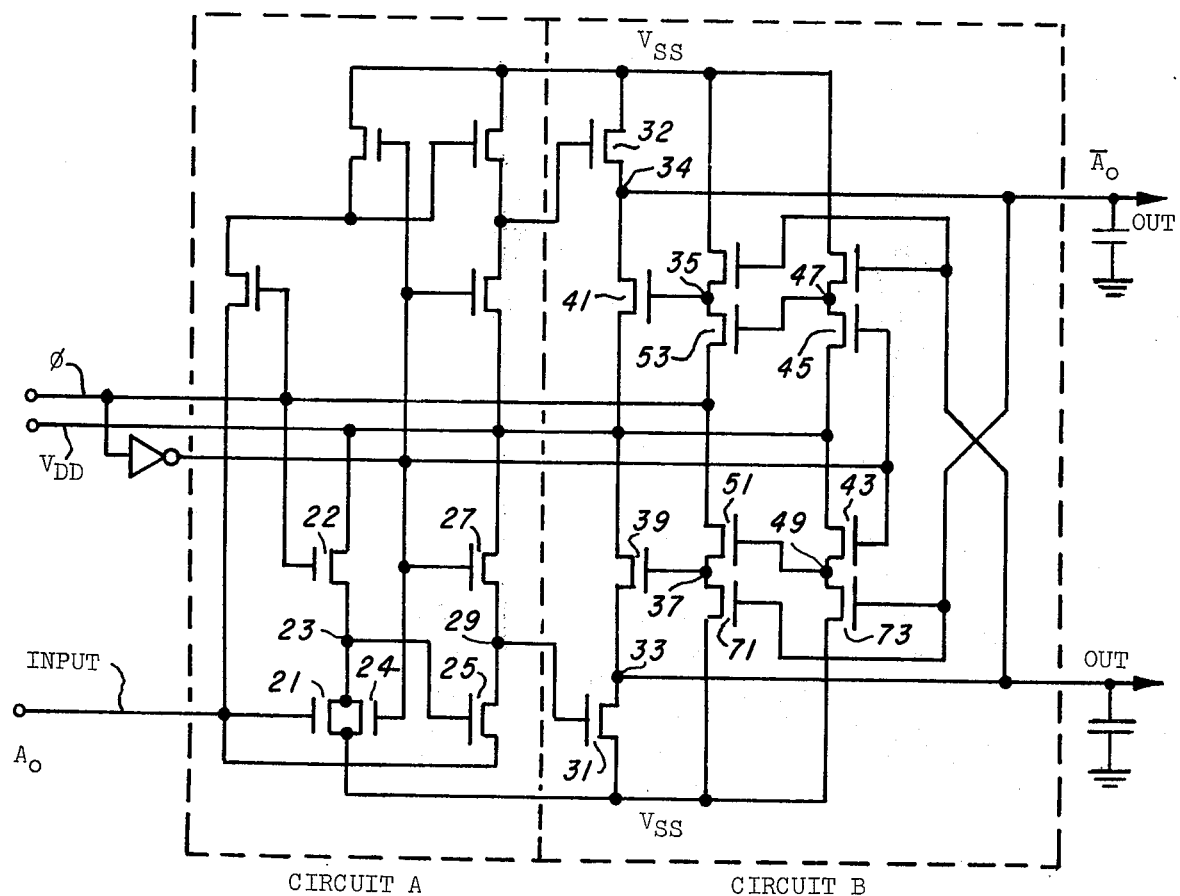
FIG. 8 is a circuit diagram of the X address buffer and Y address buffer.

Referring to FIG. 8, one of the row address inputs $A_o$ to $A_5$ is applied to the input. If the input is a "1" (assuming "1" to be a positive voltage), transistor 21 is turned on and applies a potential which is less than $V_T + V_{IN}$ to node 23. The input "1" increases the voltage at the source of transistor 25 due to the direct connection thereof to the buffer input and reduces the gate to source voltage thereof. Without using this source to input connection (that is connecting the source of transistor 25 directly to ground, as is conventionally the case), the gate of transistor 25 must be less than $V_T$. This means that the first inverter 21 must have a high beta ratio, this meaning that it would have to be larger in size and slower in speed. By these circuit connections (source of transistor 25 to input), the "0" level voltage at node 23, when transistor 21 is conducting, can be higher than in the conventional circuit by an amount $V_{IN}$. This allows a lower beta ratio between devices 21 and 22 (ratio of 21/22) or a smaller device size for transistor 21. The lower beta ratio and smaller driver device provides an increase in speed. At the same time, the use of the circuit allows for better input noise margin. This enables the circuit to be fully compatible with TTL logic.

In operation, node 29 is precharged through transistor 27 during $\bar{\phi}$ time. Therefore, node 29 is conditionally discharged, depending upon the gate voltage of transistor 25. The gate voltage of transistor 25 depends upon the input voltage as previously described.

The circuit B is utilized to conserve power. During $\bar{\phi}$ time, nodes 47 and 49 are precharged to a high level because transistors 43 and 45 are conducting. Node 37 is discharged at this time to ground level because transistors 51 and 53 are conducting and $\phi$ is at ground level. Node 33 is discharged to ground level through transistor 31 because node 29 is precharged high as previously mentioned. When $\phi$ is high, nodes 35 and 37 will be charged high and turn on load devices 39 and 41. If the terminal is high, transistor 31 is off. However, if out terminal is low, transistors 31 and 39 are both on or conducting and dissipating power between the line $V_{DD}$, the high voltage line, and the line $V_{SS}$, the ground line. This power is saved by detecting if transistor 31 is on and if the voltage at terminal out is high, turning off transistor 39 via transistors 71 and 73.

Transistor 73 detects the output voltage at terminal OUT, this being the logical opposite of the voltage at terminal $\overline{OUT}$. If the voltage on the gate of transistor 73 is high, this transistor is on as well as transistor 71. When transistor 71 is on, since transistor 73 turns off transistor 51, the gate of transistor 39 discharges to ground and turns off transistor 39, thereby turning off current through transistor 31. However, since transistor 31 is still on, the ground potential $V_{SS}$ is applied to the line $\overline{OUT}$ to improve the signal level for a ground output.

If a high voltage is sensed at terminal $\overline{OUT}$, a low voltage will be applied to terminal OUT. Accordingly, the circuit portion above the $V_{DD}$ and $\phi$ lines will operate to perform the same function since the circuits are identical, one for each of the output terminals.

It can be seen that each address buffer circuit will provide a pair of output signals, will be capable of receiving input signals from TTL devices, increased speed, and will conserve power.

Figure 9:
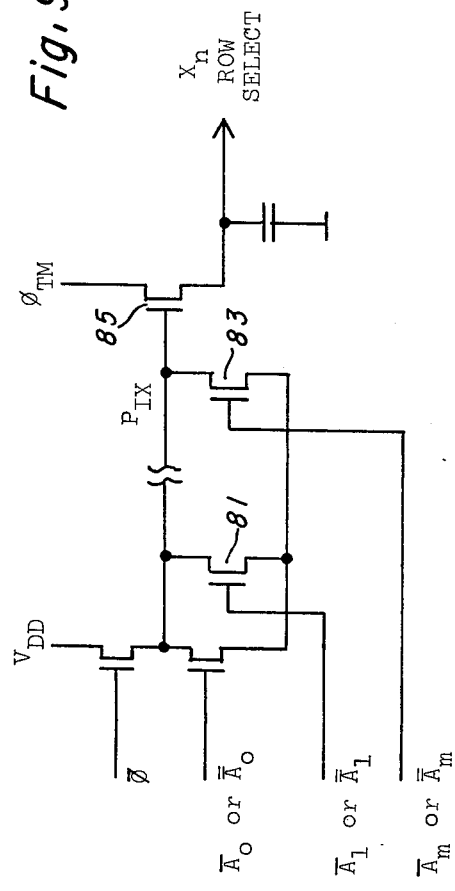
FIG. 9 is a circuit diagram of a decoding circuit as used in the present invention.

The outputs of the address buffers are applied to binary to one out of 64 decoders as set forth in FIG. 9. Only one of the decoders is shown, it being understood that 64 such circuits are present. The decoder includes six inputs for driving six parallel transistors, two of these, labeled 81 and 83, being shown. Only one of the circuits will match the input signals thereto to provide an open circuit from node PIX to ground. At time $\bar{\phi}$, the decoder will have a precharged gate on transistor 85 and at $\phi_{TM}$ provide the row select signal $X_n$. Transistor 85 provides the large drive capability required to drive the row lines. Timing signal $\phi_{TM}$ is similar to $\phi_{DXF}$ and will be explained in more detail hereinbelow.

Figure 10:
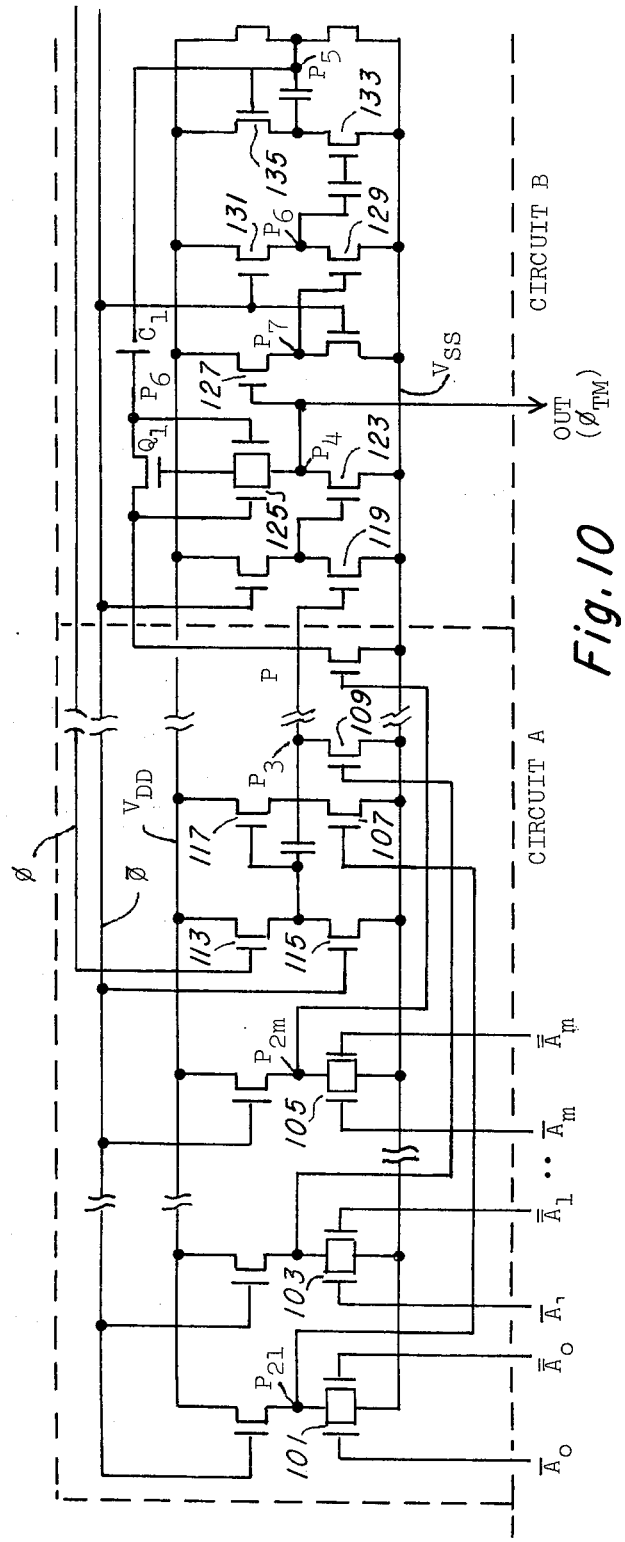
FIG. 10 is a circuit diagram of the clock generator for internally generating the $\phi_{TM}$ timing signals.

Referring now to FIG. 10, there is shown a timing circuit which generates an internal reference timing signal $\phi_{TM}$ from the single external clock signal $\phi$ to provide minimum delay with an adequate safety margin. Other internal clock signals are provided using $\phi_{TM}$ as a reference. The timing circuit cannot provide a $\phi_{TM}$ signal until all row signals have been received.

The output signals from the X address buffer are applied to a series of six NOR gates labeled 101, 103, 105, only three being shown. Each NOR gate includes a pair of transistors. When one of the two outputs from each of the address buffers, $\overline{A}_oA_o, - - - \overline{A}_mA_m$, provides a logical "1" to the NOR circuits during $\phi$ time, the nodes $P_{21} - - - P_{2m}$ will be at ground potential and turn off the associated transistors 107, 109, 111. Transistors 113 and 115 are clock load transistors and transistor 117 is a load transistor for transistors 107, 109 and 111. The transistors 107, 109, 111 act as a NOR gate and when all of the transistors thereof are off, during $\phi$ time, node P will be charged up. This will only happen after all of the X address signals from the buffer have been received, thereby preventing the possibility of operation prior to receiving a complete address and the possibility of addressing two lines simultaneously as will be shown hereinbelow. The signal at node P is below $V_{DD}$ and will go through amplification before becoming the timing signal $\phi_{TM}$ to be at the same voltage as $V_{DD}$. This is provided by the remainder of the circuit. The $\phi_{TM}$ timing signal will therefore not allow the row select signal to be provided (FIG. 9) until all of the row address signals have been received from the X address buffer circuit.

With node P high, transistor 119 is precharged and at $\bar{\phi}$ time transistor 121 is on, turning transistor 123 off. Transistor 125 is on and therefore node P4 is high. This turns on transistor 127 and charges up node P7 to turn on transistor 129. Transistor 131 precharges the gate of transistor 133 during $\bar{\phi}$ time when transistor 129 is off. Since transistor 129 is on, node P8 is low and transistor 133 is off. Since transistors 135 and 137 perform the bootstrap function, the capacitor 200 boosts node P5 high. This causes node P6 to go high and force an output $\phi_{TM}$ of the same amplitude as $V_{DD}$.

Because all of the circuits, except transistors 133 and 135, is dynamic, transistors 133 and 135 drawing low current, the power dissipation is small for generation of full voltage.

It can be seen that there has been provided a memory system which has a high density, high speed, is capable of accurately determining the logic level of the stored data or data to be stored, which can be operated with TTL devices, which operates with a single external clock pulse and generates internal clock pulses based upon the earliest time when an address is fully received.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications

What is claimed is:

1. A random access memory device which comprises, in combination:
   a. a data input terminal,
   b. a data output terminal,
   c. a matrix of memory storage cells arranged in rows and columns,
   d. a plurality of sense and refresh amplifier means, one located in the center of each of said columns of storage cells, each amplifier means having a data line associated therewith and connected to each storage cell in the associated column, a portion of each data line being positioned on each side of the amplifier means, each amplifier means including two dummy storage cells, each dummy storage cell being directly coupled to a different one of the said portions of each data line,
   e. address input means for providing a row select signal and a column select signal,
   f. read/write means for determining whether a read or a write function is to be performed,
   g. said cells being responsive to a selected row address signal and a read signal on said read means to place an indication of the data stored in each storage cell of said on the associated data line for all of the amplifier means,
   h. means responsive to a selected column address signal to read out from the amplifier means associated with said selected column onto said row output terminal, to provide a read-out operation,
   i. means responsive to a write signal to couple data from said data input terminal to said data line of the amplifier means associated with said column address signal, means responsive to said row address signal to cause said data at said line associated with said amplifier means to be stored in the storage cell in the selected column corresponding to said column address, and means responsive to said write signal to inhibit read-out to said data output terminal, and
   j. the sense and refresh amplifier means functioning to restore data read-out from the storage cells to the data lines at full logic levels when read back into the respective cells.

2. A random access memory system as set forth in claim 1, wherein said data line includes a pair of nodes, one on each side of said sense amplifier and means to isolate said nodes from each other.

3. A random access memory as set forth in claim 2 further including means to precharge both said dummy cells to store a predetermined voltage immediately prior to a read-out and write-in operation.

* * * * *

UNITED STATES PATENT AND TRADEMARK OFFICE
CERTIFICATE OF CORRECTION

PATENT NO. : 3,940,747

DATED : February 24, 1976

INVENTOR(S) : Chang-Kiang Kuo and Norishisa Kitagawa

It is certified that error appears in the above-identified patent and that said Letters Patent are hereby corrected as shown below:

Column 10, line 18, after "said" insert --row--.

Column 10, line 22, delete --row--.

Signed and Sealed this

First Day of May 1984

[SEAL]

Attest:

*Attesting Officer*

GERALD J. MOSSINGHOFF

*Commissioner of Patents and Trademarks*